United States Patent [19]
Garrity et al.

(10) Patent No.: US 7,443,333 B2
(45) Date of Patent: Oct. 28, 2008

(54) SINGLE STAGE CYCLIC ANALOG TO DIGITAL CONVERTER WITH VARIABLE RESOLUTION (75) Inventors: Douglas A. Garrity, Gilbert, AZ (US); David R. Locascio, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 61 days.

(21) Appl. No.: 11/674,435

(22) Filed: Feb. 13, 2007

(65) Prior Publication Data
US 2008/0191919 A1    Aug. 14, 2008

(51) Int. Cl.
H03M 1/34 (2006.01)
(52) U.S. Cl. .................. 341/163; 341/155; 341/161; 341/162; 341/172
(58) Field of Classification Search .......... 341/161–163
See application file for complete search history.

(56) References Cited

U.S. PATENT DOCUMENTS

| | | | |
|---|---|---|---|
| 5,644,313 A | 7/1997 | Rakers et al. | |
| 6,195,032 B1 * | 2/2001 | Watson et al. | 341/162 |
| 6,362,770 B1 * | 3/2002 | Miller et al. | 341/172 |
| 6,489,914 B1 * | 12/2002 | Jones et al. | 341/162 |
| 6,535,157 B1 | 3/2003 | Garrity et al. | |
| 6,909,393 B2 * | 6/2005 | Atriss et al. | 341/163 |
| 6,967,611 B2 * | 11/2005 | Atriss et al. | 341/172 |
| 7,068,202 B2 | 6/2006 | Waltari | |

OTHER PUBLICATIONS

Ginetti, Bernard, et al., A CMOS 13-b Cycle RSD A/D Converter, IEEE Journal of Solid-State Circuits, vol. 27, No. 7, Jul. 1992 pp. 957-965.

* cited by examiner

Primary Examiner—Khai M Nguyen
(74) Attorney, Agent, or Firm—Ingrassia, Fisher & Lorenz, P.C.

(57) ABSTRACT

A converter (200) adapted to convert an analog input signal into a digital output signal includes an analog input terminal (205) for receiving the analog input signal, a Redundant Signed Digit (RSD) stage (210) coupled to the analog input terminal, and a digital section (220). The RSD stage is configured to receive the analog input signal at the analog input terminal, produce a first number of bits at a digital output from the analog input signal during a first half of a first clock cycle, provide a residual feedback signal of the analog input signal at the analog input terminal during a second half of the first clock cycle, and produce a second number of bits at the digital output from the residual feedback signal during a first half of a second clock cycle, the second number of bits less than the first number of bits.

19 Claims, 9 Drawing Sheets

FIG. 1
(CONVENTIONAL)

SINGLE STAGE CYCLIC ANALOG TO DIGITAL CONVERTER WITH VARIABLE RESOLUTION

TECHNICAL FIELD

This disclosure relates generally to Analog-to-Digital (A/D) converters, and more particularly to Redundant Signed Digit (RSD) A/D converters.

BACKGROUND

Advances in integrated circuit technology have enabled the development of complex "system-on-a-chip" ICs for a variety of applications such as wireless communications and digital cameras. Such applications are embodied in portable electronic devices for which low power and small circuit area are important design factors. Low power and low voltage circuits are needed to decrease battery power requirements, which can allow for designs that use fewer or smaller batteries, which in turn decreases device size, weight, and operating temperature.

Such devices, however, receive analog input signals that are typically converted to digital signals. Various conventional cyclic (algorithmic) A/D converters that achieve low power operation and high resolution in a small area are known. For example, U.S. Pat. No. 6,535,157, herein incorporated by reference, discloses a cyclic RSD A/D converter having a single RSD stage followed by a digital logic section that performs synchronization and correction functions.

Figure 1:
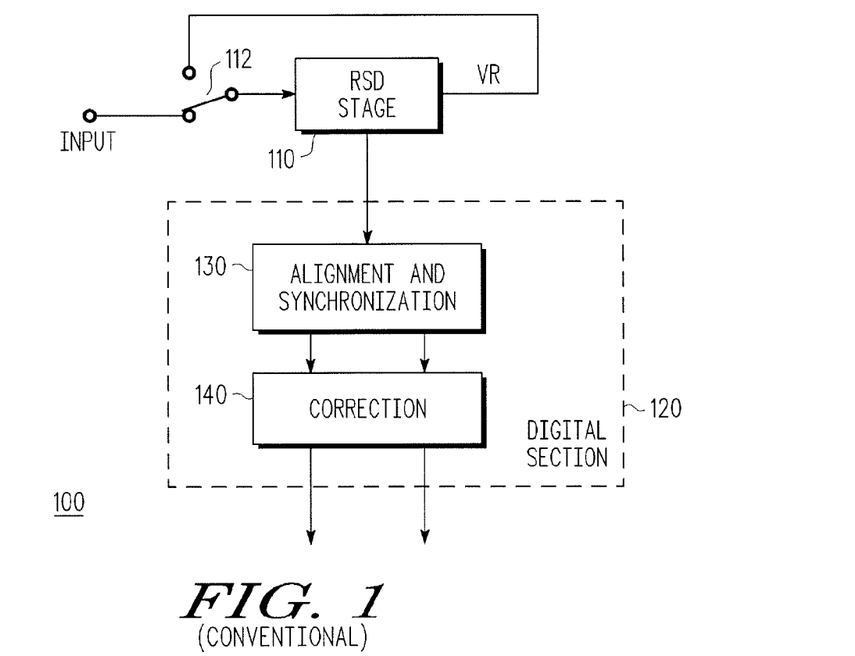
FIG. 1 is a simplified schematic block diagram illustrating a conventional single-stage RSD A/D converter.

Referring to FIG. 1, a block diagram of a cyclic RSD A/D converter 100, such as the one disclosed in U.S. Pat. No. 6,535,157, is shown. The A/D converter 100 includes an analog section having a single RSD stage 110 followed by digital section 120 having an alignment and synchronization block 130 and a correction block 140. An analog input signal (e.g., voltage) is input to the first RSD stage 110 by way of a first switch 112. The RSD stage 110 provides a digital output signal to the digital section 120. The RSD stage 110 also generates a residual voltage signal (VR), which is fed back by way of the first switch 112. The first switch 112 is closed for the first clock cycle, in which the analog input signal is received, and then opened for the remaining number of clock cycles that it takes to complete converting the analog signal to a digital signal. The feedback loop of the RSD stage 110 is directly connected from the RSD stage output to the first switch 112. The number of clock cycles to complete the A/D conversion depends on the number of bits in the digital output signal. The digital bits output from the RSD stage 110 are provided to the digital section 120, where they are aligned, synchronized, and combined to provide a standard format binary output code.

While the single stage solution of U.S. Pat. No. 6,535,157 provides a low power, high resolution, and high speed A/D converter 100, there is still a need for a single stage A/D converter that uses less power and has a decreased silicon area. Embodiments of the invention address these and other disadvantages of the related art.

SUMMARY

According to an example embodiment, a converter that is adapted to convert an analog input signal into a digital output signal includes an analog input terminal for receiving the analog input signal and a Redundant Signed Digit (RSD) stage coupled to the analog input terminal. According to the example embodiment, the RSD stage is configured to receive the analog input signal at the analog input terminal, produce at least two digital bits at a digital output from the analog input signal during a first half of a first clock cycle, provide a residual feedback signal of the analog input signal at the analog input terminal during a second half of the first clock cycle, and produce a single digital bit at the digital output from the residual feedback signal during a first half of a second clock cycle. According to the example embodiment, the converter further includes a digital section coupled to the digital output, the digital section configured to combine the at least two digital bits and the single digital bit into the digital output signal.

According to another example embodiment, a cyclic Redundant Signed Digit (RSD) Analog to Digital (A/D) converter includes an input terminal for receiving an analog input signal, a first switch connected between the input terminal and a first node, the first switch operable to apply the analog input signal to the first node, and a second switch connected between the first node and a second node, the second switch operable to apply a residual voltage feedback signal to the first node, the first switch operable to be closed when the second switch is open, the second switch operable to be closed when the first switch is open. According to the example embodiment, the RSD A/D converter further includes an operational amplifier having an output terminal connected to the second node, the operational amplifier operable to generate the residual voltage feedback signal and apply it to the second node, comparators, each comparator having a first input coupled to the first node and an output, each of the comparators operable to compare a selected one of the analog input signal and the residual voltage feedback signal to a predetermined voltage signal, and a logic circuit coupled to the outputs of the comparators, the logic circuit operable to generate a first digital output signal during a first clock phase of an A/D conversion and operable to generate a second digital output signal during a second clock phase of the A/D conversion, the first digital output signal based upon the outputs from a first set of the comparators, the second digital output signal based upon the outputs from a second set of the comparators.

According to another example embodiment, a method for converting an analog input signal into a plurality of digital bits of a digital output signal includes the steps of receiving the analog input signal, producing at least two digital bits of the plurality of digital bits from the analog input signal during a first half of a first clock cycle, and producing a first residual voltage from the analog input signal during a second half of the first clock cycle. The method further includes producing a single bit of the plurality of digital bits from the first residual voltage during a first half of a second clock cycle.

BRIEF DESCRIPTION OF THE DRAWINGS

The following detailed description of some example embodiments will be better understood when read in conjunction with the appended drawings. It should be understood, however, that example embodiments are not limited to the precise arrangements and instrumentalities shown. In the drawings, like numerals are used to indicate like elements throughout. Furthermore, other desirable features and characteristics will become apparent from the subsequent detailed description and the appended claims, taken in conjunction with the accompanying drawings and the foregoing technical field and background.

For simplicity and clarity of illustration, the drawing figures illustrate the general manner of construction, and descriptions and details of well-known features and techniques may be omitted to avoid unnecessarily obscuring aspects of the illustrated embodiments. Additionally, elements in the drawings figures are not necessarily drawn to scale. For example, the dimensions of some of the elements or regions in some of the figures may be exaggerated relative to other elements or regions of the same or other figures to help improve understanding of the example embodiments. In the drawings.

DETAILED DESCRIPTION OF EXAMPLE EMBODIMENTS

The detailed description set forth below in connection with the appended drawings is intended as a description of some of the example embodiments, and is not intended to completely describe all possible embodiments. That is, there is no intention to be bound by any expressed or implied theory presented in the preceding technical field, background, or the following detailed description of example embodiments. It is to be understood that the same or equivalent functions may be accomplished by different embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises, includes, or has a list of elements is not necessarily limited to those elements, but may include other elements not expressly listed or inherent to such process, method, article, or apparatus.

Figure 2:
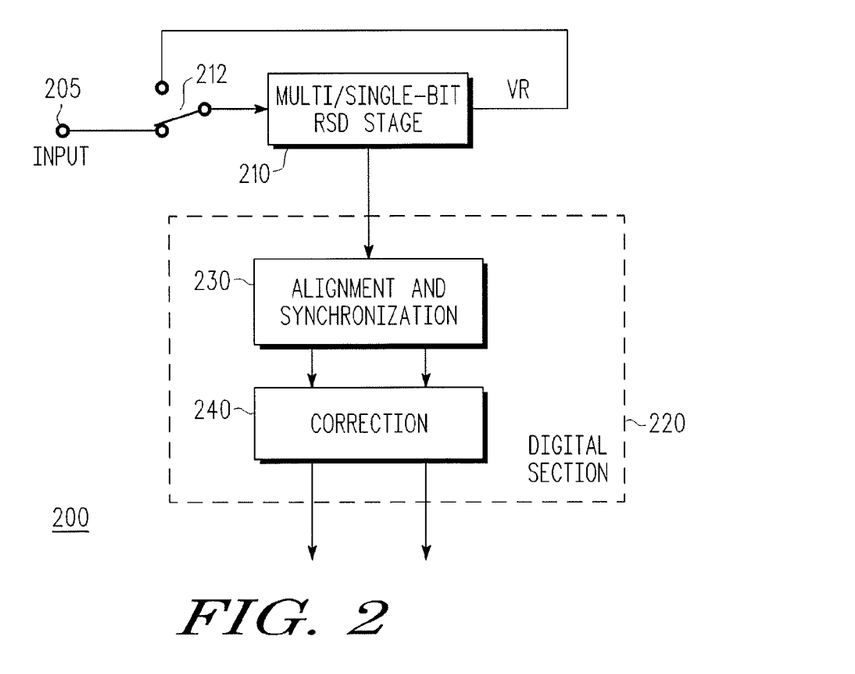
FIG. 2 is a schematic block diagram of a single-stage RSD A/D converter in accordance with example embodiments.

FIG. 2 is a schematic block diagram of a single-stage RSD A/D converter in accordance with an example embodiment. The A/D converter 200 includes a single multi-bit/single-bit RSD stage 210 and a digital section 220. The digital section 220 has an alignment and synchronization block 230 and a correction block 240. An analog input signal (e.g., voltage) 205 is presented to an input of the single multi-bit/single-bit RSD stage 210 by way of a first switch 212. The RSD stage 210 provides a digital output signal to the digital section 220. The RSD stage 210 also generates a residual voltage signal (VR), which is fed back to the input of the RSD stage by way of the first switch 212. The first switch 212 is closed for the first cycle, in which the analog input signal 205 is received, and then opened for the remaining number of cycles that it takes to complete converting the analog signal to a digital signal. Preferably, the feedback loop of the RSD stage 210 is directly connected from the RSD stage output to the first switch 212, without any intervening circuitry such as a comparator. The number of cycles to complete an A/D conversion of the analog input signal to a digital output signal depends on the number of bits in the digital output signal. The digital bits output from the RSD stage 210 are provided to the digital section 220, where they are aligned, synchronized, and combined to provide a standard format binary output code.

The architecture of FIG. 2 is capable of achieving significant reductions in total capacitance, area, and power relative to the architecture of FIG. 1. This is because, according to example embodiments, the single multi-bit/single-bit RSD stage 210 is initially configured to have a resolution of at least 2.5 bits during a first clock phase of the A/D conversion, then reconfigured to have a resolution of 1.5 bits during subsequent clock phases of the A/D conversion.

Figure 3:
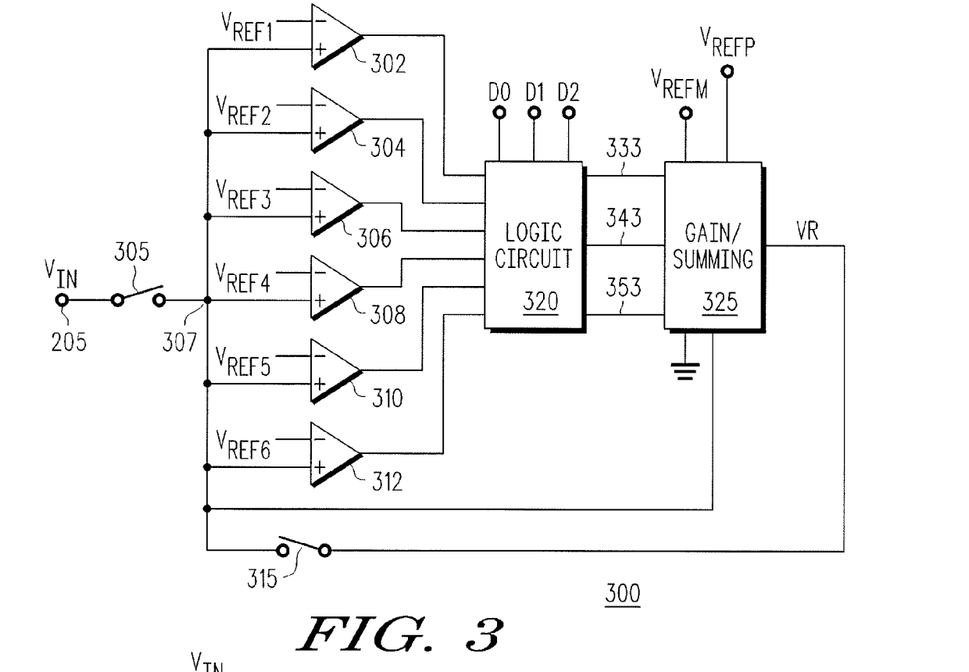
FIG. 3 is a schematic block diagram of an example embodiment of the single multi-bit/single-bit RSD stage of FIG. 2.

FIG. 3 is a schematic block diagram of an example embodiment 300 of the single multi-bit/single-bit RSD stage of FIG. 2. The RSD stage 300 includes the input terminal 205 at which the analog input signal (VIN) is applied and a first switch 305 that is used to selectively apply the analog input signal (VIN) to the node 307. The RSD stage 300 also includes a feedback switch 315 that is used to selectively apply a residual voltage feedback signal (VR) to the node 307.

The RSD stage 300 further includes a first, second, third, fourth, fifth, and sixth comparators 302, 304, 306, 308, 310, and 312, respectively. Because the RSD stage 300 has six comparators, it can achieve a maximum resolution of 2.5 bits. Although the six comparator configuration illustrated in FIG. 3 is preferred, alternative embodiments may have more than six comparators. In other words, alternative embodiments may achieve resolutions that are greater than 2.5 bits. Each of the comparators 302, 304, 306, 308, 310, and 312 has a positive input terminal that is connected to the node 307. Depending on the state of the first switch 305 and the feedback switch 315, the positive input terminals of the comparators 302, 304, 306, 308, 310, and 312 receive either the analog input signal or the residual voltage feedback signal. That is, a selected one of the analog input signal and the residual voltage feedback signal is input to the positive input terminals of the first through sixth comparators 302, 304, 306, 308, 310, and 312 through the use of the switches 305 and 315. Preferably, the residual voltage feedback signal VR is provided to the comparators 302, 304, 306, 308, 310, and 312 via a direct feedback signal path as shown in FIG. 3 (i.e., no intervening circuitry, such as a sample and hold circuit).

Each of the comparators 302, 304, 306, 308, 310, 312 also has a negative input terminal that receives a first, second, third, fourth, fifth, and sixth predetermined voltage signals, respectively (e.g., VREF1, VREF2, VREF3, VREF4, VREF5, and VREF6). Each of the first, second, third, fourth, fifth, and sixth comparators 302, 304, 306, 308, 310, and 312 compare the signals applied to their respective input terminals to generate a comparator output signal.

According to an example embodiment, the RSD stage 300 is configurable such that, during an A/D conversion process for an analog input signal that occurs over a number of sequential clock phases, the values of the predetermined voltage signals (VREF1, VREF2, VREF3, VREF4, VREF5, and VREF6) may be selectively changed for each one of the clock phases. For example, during a first clock phase of the analog to digital conversion, each of the first, second, third, fourth, fifth, and sixth predetermined voltage signals (VREF1, VREF2, VREF3, VREF4, VREF5, and VREF6) may each be set to a unique value. During second and subsequent clock phases of the analog to digital conversion, some or all of the first, second, third, fourth, fifth, and sixth predetermined voltage signals (VREF1, VREF2, VREF3, VREF4, VREF5, and VREF6) may be changed to have a different value then in a previous clock phase.

According to the example embodiment, during clock phases of the A/D conversion after the first clock phase, the RSD stage 300 uses outputs from less than all of the comparators 302, 304, 306, 308, 310, and 312. In other words, for clock phases after the first clock phase, the resolution that is achieved from the single-bit/multi-bit RSD stage 300 is reduced relative to the resolution of the first clock phase. These aspects of the example embodiment are described in greater detail below.

The outputs of the first, second, third, fourth, fifth, and sixth comparators 302, 304, 306, 308, 310, and 312 are connected to a logic circuit 320. During clock phases of an A/D conversion process, the logic circuit 320 is capable of generating a digital output signal that is representative of the selected one of either the analog input signal or the residual voltage feedback signal. In an example embodiment, the logic circuit 320 generates three raw digital bits (D0, D1, D2) as the digital output signal during a clock phase of an A/D conversion process based upon the output from all the comparators 302, 304, 306, 308, 310, 312. In the example embodiment, the logic circuit 320 generates two raw digital bits (D0, D1) as the digital output signal during another clock phase of the A/D conversion process based upon outputs from less than all of the comparators 302, 304, 306, 308, 310, 312. In a preferred embodiment, the three digital bits (D0, D1, D2) are generated during the first clock phase of the A/D conversion process. The digital bits generated during any clock phase of the A/D conversion are aligned and synchronized in the digital section 220, and then combined with the digital bit or bits from other clock phases of the A/D conversion to form a formatted binary output code.

During clock phases of the A/D conversion, the logic circuit 320 is also capable of generating a high switch control signal 333, a mid switch control signal 353, and a low switch control signal 343 based upon at least two of the output signals from the comparators 302, 304, 306, 308, 310, and 312.

The single-bit/multi-bit RSD stage 300 additionally includes a programmable gain/summing element 325. The programmable gain/summing element 325 receives as inputs the high switch control signal 333, the mid switch control signal 353, the low switch control signal 343, the selected one of the analog input signal and the residual voltage feedback signal from node 307, a first reference voltage VREFP, a second reference voltage VREFM, and a ground voltage. The programmable gain/summing element 325 generates the residual voltage feedback signal VR. Although the actual transfer function associated with the programmable gain/summing element 325 will be dependent upon the particular design, generally speaking, the residual voltage feedback signal VR may be thought of as a sum of two products. Depending on the particular clock phase of the A/D conversion, the first product is either the analog input signal or a previously generated value of the residual voltage feedback signal, multiplied by a first gain factor. The second product is a selected one of the reference voltages (VREFP, VREFM, or zero), multiplied by a second gain factor.

The feedback switch 315 is provided for selecting the residual voltage feedback signal as an input to the programmable gain/summing element 325 and the comparators 302, 304, 306, 308, 310, and 312. The feedback switch 315 is disposed between the output of the programmable gain/summing element 325 and the node 307. When the feedback switch 315 is closed, the first switch 305 is open so that the residual voltage feedback signal is input to the programmable gain/summing element 325 and the comparators 302, 304, 306, 308, 310, and 312. When the first switch 305 is closed, the feedback switch 315 is open so that the analog input signal is input to the programmable gain/summing element 325 and the comparators 302, 304, 306, 308, 310, and 312. As discussed above, the first switch 305 is closed in a first clock cycle during the conversion of the analog input signal and the first switch 305 is open for subsequent cycles of converting the analog input signal.

Figure 4:
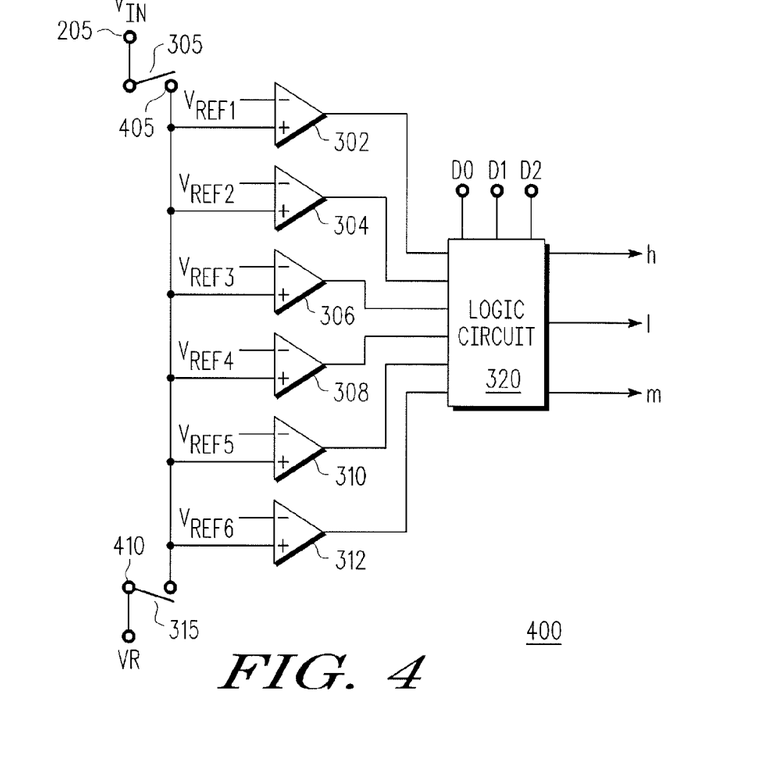
FIG. 4 is a schematic circuit diagram illustrating an example sub-ADC that may be used to implement the multi-bit/single-bit RSD stage of FIG. 3.
Figure 5:
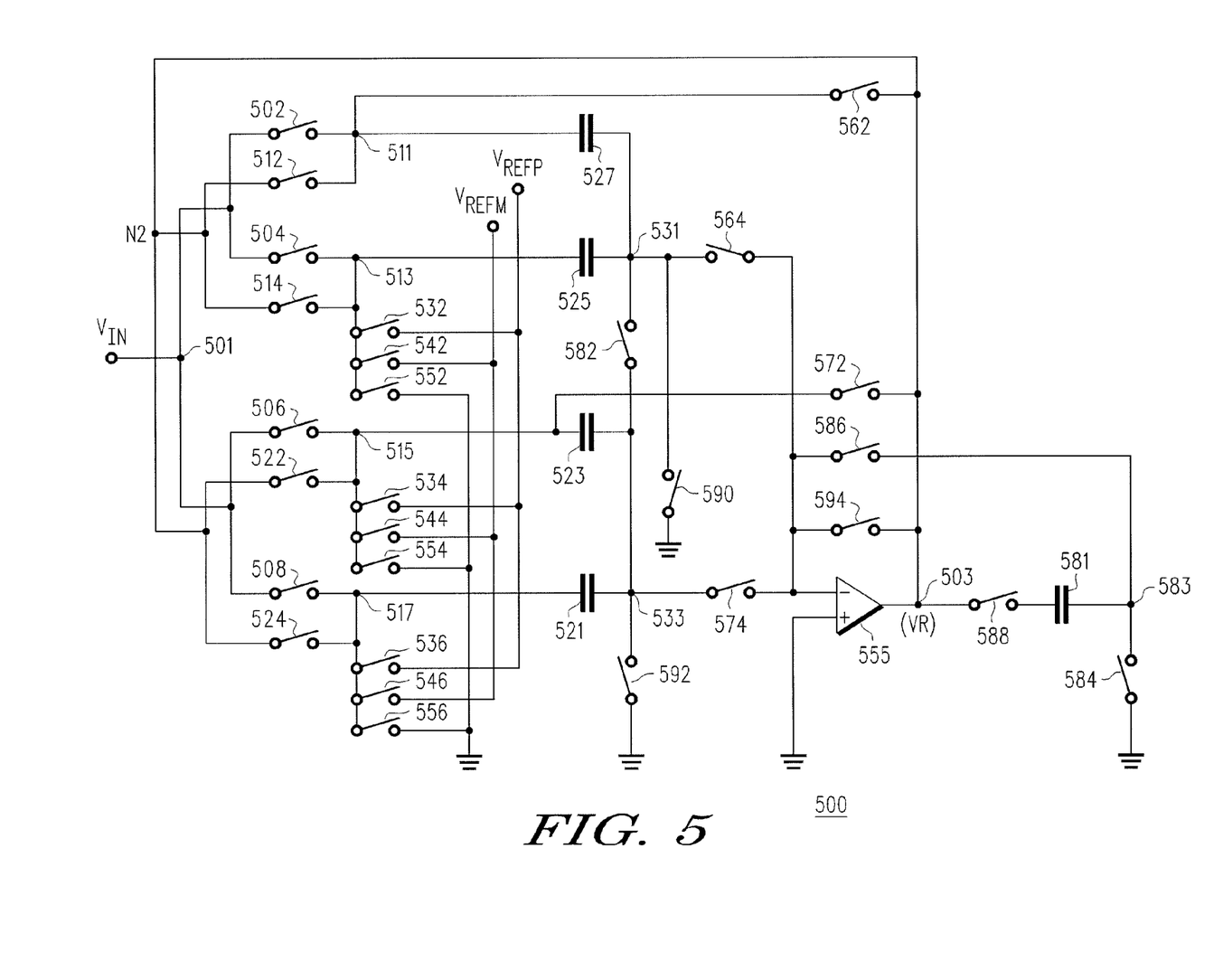
FIG. 5 is a schematic circuit diagram illustrating an example MDAC that may be used to implement the multi-bit/single-bit RSD stage of FIG. 3.

FIGS. 4 and 5 are schematic circuit diagrams that illustrate in further detail the multi-bit/single-bit RSD stage 300 of FIG. 3 in accordance with an example embodiment. FIG. 4 illustrates a sub-ADC 400 in accordance with an example embodiment, while FIG. 5 illustrates a Multiplying Digital-to-Analog Converter (MDAC) 500 in accordance with an example embodiment. The multi-bit/single-bit RSD stage 300 illustrated in FIG. 3 may be implemented with the sub-ADC 400 of FIG. 4 and the MDAC 500 of FIG. 5.

Referring to FIG. 4, the sub-ADC 400 includes the input terminal 205 that receives an analog input signal (VIN). The first switch 305 is disposed between the input terminal 205 and a first node 405. The first switch 305 is operable to selectively apply the analog input signal to the first node 405 when the first switch is closed. The feedback switch 315 is disposed between the first node 405 and a second node 410. The feedback switch 315 is operable to selectively apply the residual voltage feedback signal (VR) to the first node 405 when the feedback switch is closed. As was discussed above, when the first switch 305 is closed, the feedback switch 315 is open and when the first switch 305 is open, the feedback switch 315 is closed. The first switch 305 is closed during a first clock phase of an A/D conversion process and the feedback switch 315 is closed during subsequent clock phases of the A/D conversion process.

The sub-ADC 400 further includes first, second, third, fourth, fifth, and sixth comparators 302, 304, 306, 308, 310, and 312, respectively. The operation of the comparators 302, 304, 306, 308, 310, 312 is the same as what was described above for FIG. 3. The sub-ADC 400 further includes the logic circuit 320. The logic circuit 320 is connected to the first through sixth comparators 302, 304, 306, 308, 310, 312 and receives the output signals from the first through sixth comparators.

According to an example embodiment, during the first clock phase of an A/D conversion process, the logic circuit 320 generates three raw digital bits (D0, D1, D2) based upon the output signals from each of the first through sixth comparators 302, 304, 306, 308, 310, 312. According to the example embodiment, the logic circuit 320 generates two raw digital bits (D0, D1) during one or more subsequent clock phases of the A/D conversion process, based upon the output signals from less than all of the comparators 302, 304, 306, 308, 310, 312. The logic circuit also generates control signals (h, l, m), which are used to control some switches of the MDAC 500. This will be explained in further detail below. The control signals h, l, m correspond to the high, low, and mid switch control signals 333, 343, and 353 of FIG. 3, respectively.

The programmable gain/summing element 325 of FIG. 3 may be implemented using the MDAC 500 of FIG. 5. Referring to FIG. 5, the MDAC 500 includes an operational amplifier (op-amp) 555, capacitors 521, 523, 525, 527, and 581, and switches 502, 504, 506, 508, 512, 514, 522, 524, 532, 534, 536, 542, 544, 546, 552, 554, 556, 562, 564, 572, 574, 582, 584, 586, 588, 590, 592, and 594, all of which are arranged in the manner shown in FIG. 5. For completeness, it should be noted at this point that other MDAC designs that implement the programmable gain/summing element 325 of FIG. 3 may be conceived by those of skill in the art that are structurally dissimilar to MDAC 500 but nevertheless accomplish the same function. For example, some or all of the switches shown in FIG. 5 could be implemented using transistors.

The circuit connections illustrated in FIG. 5 are as follows. The analog input signal at node 501 is selectively connected to the nodes 511, 513, 515, 517 by way of the switches 502, 504, 506, and 508, respectively. The residual voltage feedback signal at node 503 is selectively connected to the nodes 511, 513, 515, 517 by the switches 512, 514, 522, and 524, respectively. The nodes 513, 515, and 517 are selectively connected to the predetermined high reference voltage source (VREFP) by the switches 532, 534, and 536, respectively. The nodes 513, 515, and 517 are selectively connected to the predetermined low reference voltage source (VREFM) by the switches 542, 544, and 546, respectively. The nodes 513, 515, and 517 are selectively connected to the predetermined zero voltage source by the switches 552, 554, and 556, respectively. The node 511 is selectively connected to the node 503 by the switch 562. Capacitor 521 is coupled between the nodes 517 and 533. Capacitor 523 is coupled between the nodes 515 and 533. Capacitor 525 is coupled between the nodes 513 and 531. Capacitor 527 is coupled between the nodes 511 and 531. Node 531 is selectively connected to the predetermined zero voltage by switch 590. Node 533 is selectively connected to the predetermined zero voltage by switch 592. Node 531 is selectively connected to node 533 by switch 582. Node 531 is selectively connected to the negative input terminal of the op-amp 555 by switch 564, while node 533 is selectively connected to the negative input terminal of the op-amp by the switch 574. Node 515 is selectively connected to the node 503 through switch 572. The negative input terminal of the op-amp 555 is selectively connected to the node 583 by the switch 586. The negative input terminal of the op-amp 555 is selectively connected to the node 503 by the switch 594. The positive input terminal of the op-amp 555 is tied to the predetermined zero voltage. The capacitor 581 is selectively coupled between the node 503 and the node 583 by the switch 588. Node 583 is selectively coupled to the predetermined zero voltage by the switch 584.

According to an example embodiment, during a clock phase of an A/D conversion process the MDAC 500 is operable to produce a first gain factor of four (4) for the analog input signal and a selected second gain factor of zero, one, two, or three (0, 1, 2, or 3) for a selected one of the reference voltages (VREFP, VREFM, or zero). According to the example embodiment, during subsequent clock phases of the A/D conversion the MDAC 500 is operable to produce a first gain factor of two (2) for the residual voltage feedback signal and a selected second gain factor of zero or one (0 or 1) for a selected one of the reference voltages (VREFP, VREFM, or zero). It should be recalled that that the MDAC 500 illustrated in FIG. 5 is but one possible implementation for the programmable gain/summing element 325 of FIG. 3. Alternative embodiments may implement the programmable gain/summing element 325 with different MDAC designs, but the embodiments will nevertheless still be capable of applying different gain factors to the analog input signal, the residual voltage feedback signal, and the selected reference voltage during different clock phases of an A/D conversion.

Switches 305 and 315 of FIG. 4, as well as the switches included in the MDAC 500 of FIG. 5, control the operation of the multi-bit/single-bit RSD stage 300. As will become apparent in the following paragraphs, some of the switches in the MDAC 500 are controlled using control signals that are derived from a common clock signal, while other switches are controlled by the high, low, and mid-switch control signals (h, l, m) that are generated by the logic circuit 320 of the sub-ADC 400. The details associated with deriving one or several control signals from a clock signal is not explained in further detail here, as they are not critical for an understanding of the example embodiments.

The switches that are included in the MDAC 500 of FIG. 5 are all listed in the left column of Table I, which appears below this paragraph. Control signals are listed in the right column of Table I. For each switch or group of switches appearing in the rows of the left column, the corresponding row in the right column contains the control signal or control signals that determine the state of the switch or group of switches. The (OR) notation for switches 590 and 592 refers to the logical OR function.

TABLE I

| Switch(es) | Control Signal |
|---|---|
| 502, 504, 506, 508 | SWVIN |
| 512, 514 | SWFB1 |
| 522, 524 | SWFB2 |

TABLE I-continued

| Switch(es) | Control Signal |
|---|---|
| 532, 534, 536 | h (from logic circuit 320) |
| 542, 544, 546 | l (from logic circuit 320) |
| 552, 554, 556 | m (from logic circuit 320) |
| 562, 564 | MFB1 |
| 572, 574 | MFB2 |
| 582, 584 | $H_O$ |
| 586 | $H_E$ |
| 588 | $H_{SH}$ |
| 590 | SWVIN (OR) SWFB1 |
| 592 | SWVIN (OR) SWFB2 |
| 594 | reset |

Figure 6:
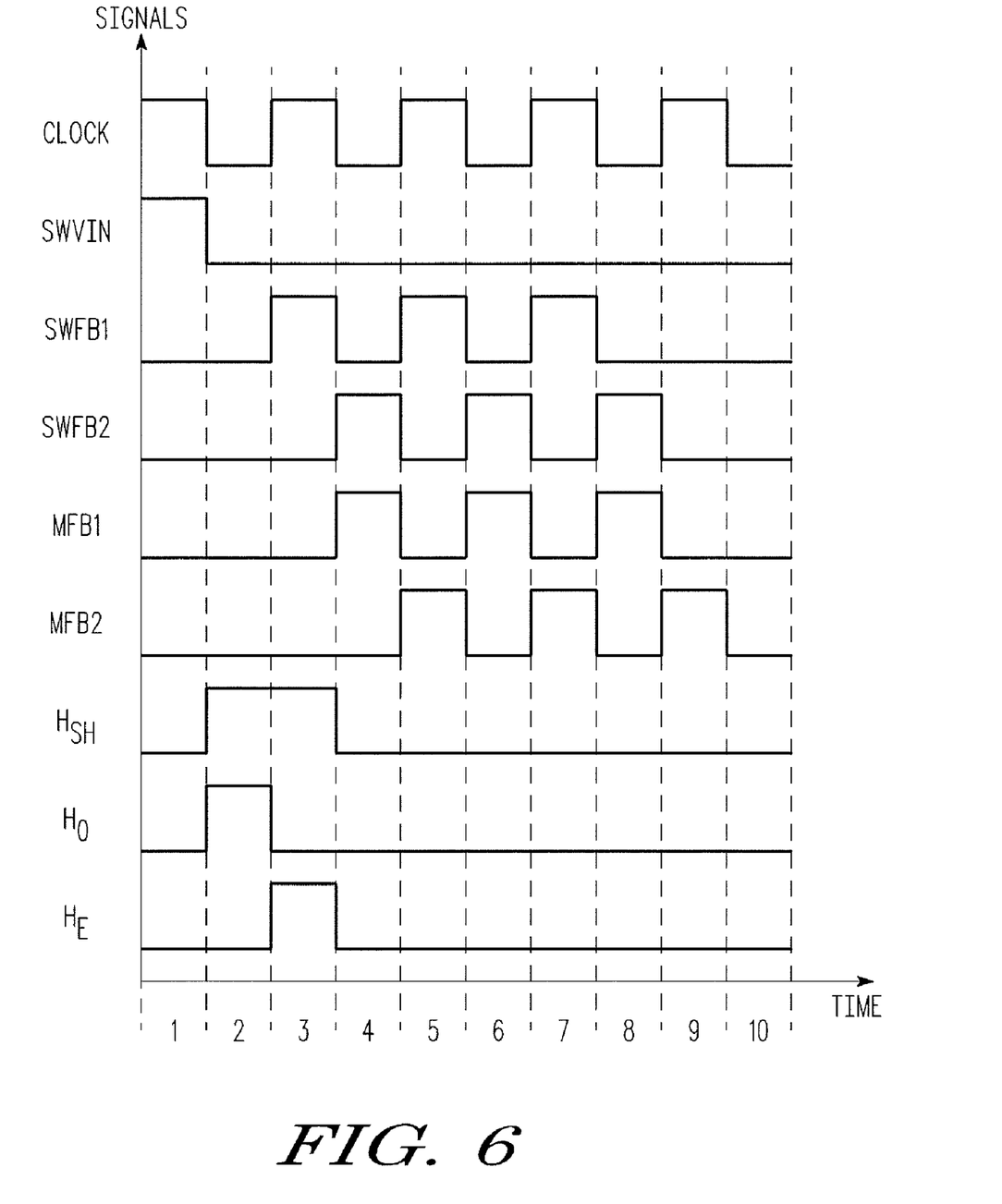
FIG. 6 is an example timing diagram illustrating control signals that may be used to perform an example 10-bit A/D conversion process with the sub-ADC of FIG. 4 and the MDAC of FIG. 5.

FIG. 6 is an example timing diagram illustrating control signals that may be used to perform an example 10-bit A/D conversion using the sub-ADC 400 of FIG. 4 and the MDAC 500 of FIG. 5. FIG. 6 illustrates a clock signal, as well as control signals that were named in Table I that are derived from the clock signal. In FIG. 6, one clock cycle is defined as the time between adjacent rising edges of the clock signal. A clock phase is each "up" or "down" period of the clock signal. Thus, FIG. 6 illustrates control signals from Table II for ten sequential clock phases or five clock cycles.

Table II, which appears below this paragraph, illustrates the state of all the switches that are controlled by the control signals of FIG. 6 during each of the ten clock phases illustrated in FIG. 6. In Table II, an "X" indicates that the associated switch or switches are closed, while the absence of an entry indicates that the associated switch or switches are open. Table II was derived using Table I and FIG. 6. For example, according to Table 1, the state of switch 592 is controlled based upon the logical expression SWVIN OR SWFB2. FIG. 6 illustrates that the control signal SWVIN or the control signal SWFB2 is at a logic "high" state during the first, fourth, sixth, and eighth clock phases. Consequently, Table II illustrates that switch 592 is closed during the first, fourth, sixth, and eighth clock phases. The state of the other switches may be derived in the same manner. Table II therefore provides a convenient way to summarize the state of switches that are illustrated in FIG. 5 during the ten clock phases illustrated in FIG. 6.

TABLE II

| | Clock Phase | | | | | | | | | |
|---|---|---|---|---|---|---|---|---|---|---|
| Switch(es) | 1 | 2 | 3 | 4 | 5 | 6 | 7 | 8 | 9 | 10 |
| 502, 504, 506, 508 | X | | | | | | | | | |
| 512, 514 | | | X | | X | | X | | | |
| 522, 524 | | | | X | | X | | X | | |
| 562, 564 | | | | X | | X | | X | | |
| 572, 574 | | | | | X | | X | | X | |
| 582, 584 | | X | | | | | | | | |
| 586 | | | X | | | | | | | |
| 588 | | X | X | | | | | | | |
| 590 | X | | X | | X | | X | | | |
| 592 | X | | | X | | X | | X | | |

FIGS. 7-15 are simplified circuit diagrams illustrating the configuration of the sub-ADC 400 of FIG. 4 and the MDAC 500 of FIG. 5 for the first nine clock phases of the example 10-bit A/D conversion using the control signals illustrated in FIG. 6. The simplified circuit diagrams of FIGS. 7-15 may be obtained using the status of the switches during each phase of the 10-bit A/D conversion as summarized in Table II. Thus, FIG. 7 corresponds to the first clock phase, FIG. 8 corresponds to the second clock phase, FIG. 9 corresponds to the third clock phase, etc., up to FIG. 15, which corresponds to the ninth clock phase. A diagram corresponding to the tenth clock phase omitted because, as can be seen in Table II, all switches are open resulting in an uninteresting configuration for MDAC 500. In order to increase clarity, none of the switches illustrated in FIG. 5 are shown in the simplified circuit diagrams of FIGS. 7-15, and any capacitor 521, 523, 525, 527, 581 that is grounded on both sides during a particular clock phase is not illustrated in the FIGURE corresponding to that clock phase. In the paragraphs that follow, the example 10-bit A/D conversion process as performed by the sub-ADC 400 of FIG. 4 and the MDAC 500 of FIG. 5 will be explained in greater detail.

Figure 7:
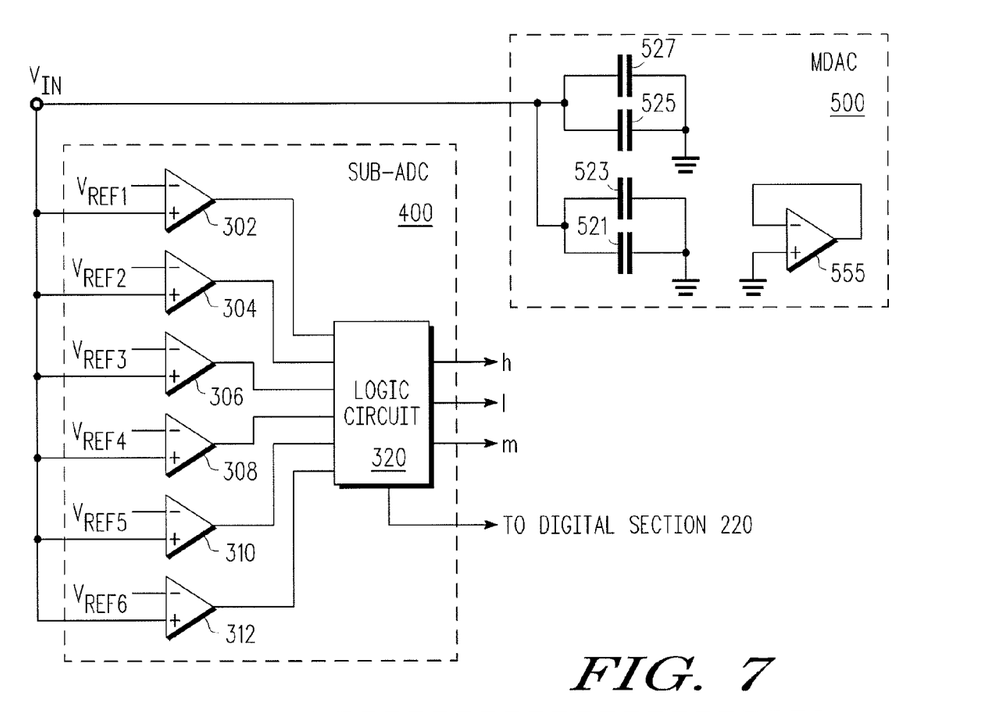
FIG. 7 is a simplified circuit diagram illustrating the configuration of the sub-ADC of FIG. 4 and the MDAC of FIG. 5 during the first clock phase of the example 10-bit A/D conversion process.

FIG. 7 is a simplified circuit diagram illustrating the configuration of the sub-ADC 400 and the MDAC 500 during the first clock phase of the example 10-bit A/D conversion process. During the first clock phase, the analog input is sampled by the MDAC 500 and the sub-ADC 400, which uses outputs from all of the comparators 302, 304, 306, 308, 310, and 312 to generate three bits of raw digital data which are sent to the digital section 220 of FIG. 2. During the first clock phase, the reset signal is asserted to close the switch 594 of FIG. 5, which results in the resetting of op-amp 555. According to other embodiments, the op-amp 555 may be reset during the first clock phase for any n-bit A/D conversion process.

Figure 8:
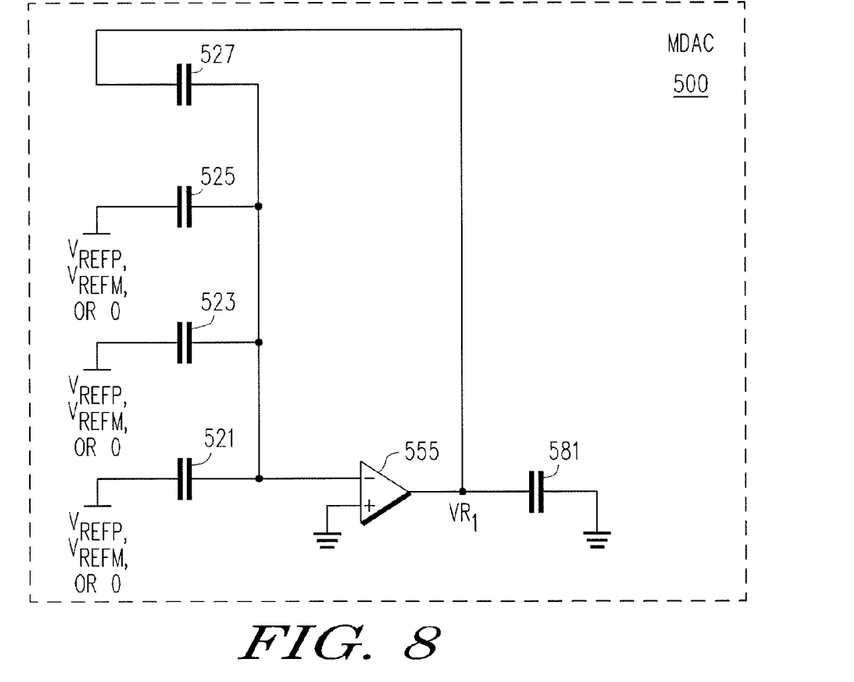
FIG. 8 is a simplified circuit diagram illustrating the configuration of the sub-ADC of FIG. 4 and the MDAC of FIG. 5 during the second clock phase of the example 10-bit A/D conversion process.

FIG. 8 is a simplified circuit diagram illustrating the configuration of the sub-ADC 400 and the MDAC 500 during the second clock phase of the example 10-bit A/D conversion process. During the second clock phase, the op-amp 555 generates the residual voltage feedback signal $VR_1$ based upon the full sub-ADC 400 results from the previous first clock phase. As was explained above, $VR_1$ is generated using four as the first gain factor for the analog input signal and using two as the second gain factor for a selected one of the predetermined reference voltage sources (VREFP, VREFM, zero). The capacitors 521, 523, and 525 are tied to either the predetermined high reference voltage source (VREFP), the predetermined low reference voltage source (VREFM), or the predetermined zero reference voltage based upon the high, low, and the mid switch control signals (h, l, m). As was explained above, the high, low, and mid switch control signals h, l, m determine the state of the switches 532, 534, 536, 542, 544, 546, 552, 554, 556 (FIG. 5) of the MDAC 500. During the second clock phase, the residual voltage feedback signal $VR_1$ is sampled on to the capacitor 581. Note that during the second clock phase, the sub-ADC 400 does not generate a digital output signal of one or more raw digital bits. According to other embodiments, the sub-ADC 400 does not generate a digital output signal during the second clock phase for any n-bit A/D conversion process.

Figure 9:
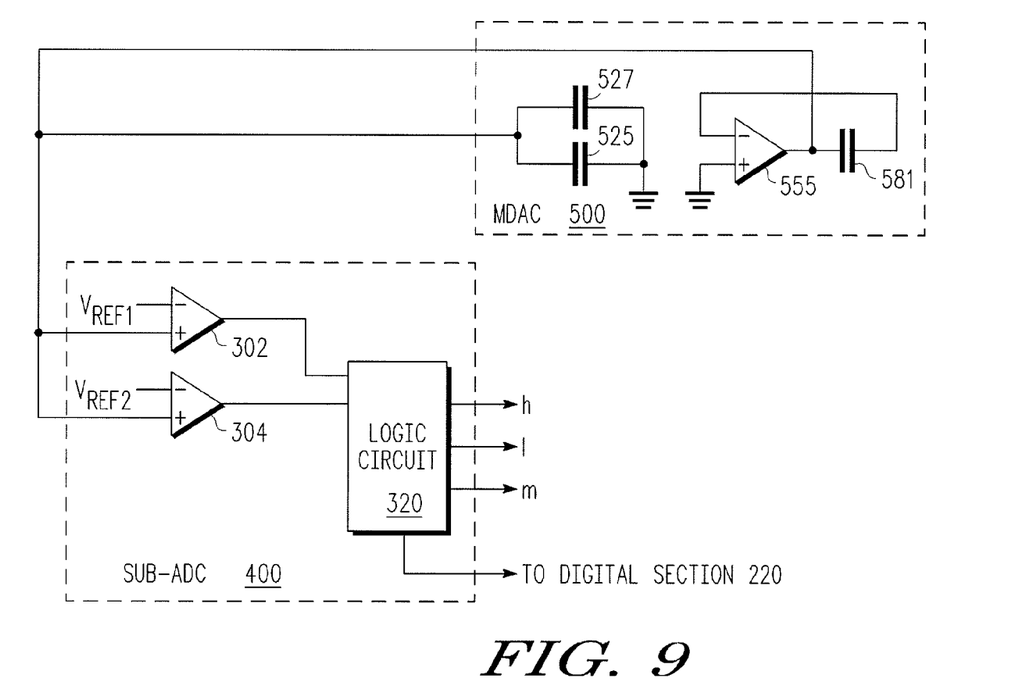
FIG. 9 is a simplified circuit diagram illustrating the configuration of the sub-ADC of FIG. 4 and the MDAC of FIG. 5 during the third clock phase of the example 10-bit A/D conversion process.

FIG. 9 is a simplified circuit diagram illustrating the configuration of the sub-ADC 400 and the MDAC 500 during the third clock phase of the example 10-bit A/D conversion process. During the third clock phase, the residual voltage feedback signal $VR_1$ generated during the previous second clock phase is held and sampled on to the capacitors 525 and 527 as well as sampled by the comparators 302 and 304 of the sub-ADC 400. During the third clock phase, the first predetermined voltage signal (VREF1) may be a predetermined high voltage (VH) that is applied to the negative input terminal of the first comparator 302. During the third clock phase, the second predetermined voltage signal (VREF2) may be a predetermined low voltage (VL) that is applied to the negative input terminal of the second comparator 304. The actual voltage values for VH and VL are a function of process technology since that may limit power supply voltages. However, in one example embodiment, VH is about 1.5 Volts (V) and more preferably about 1.475 V, while VL is about 1.2 V and more preferably about 1.225 V. Based upon the output signals from the comparators 302, 304, the logic circuit 320 of the sub-ADC 400 may generate new values for the high, low, and mid switch control signals (h, l, m). The sub-ADC 400 also generates two raw digital bits at the end of the third clock phase, which are sent to the digital section 220 of FIG. 2. It will be appreciated by those of ordinary skill that the resolution achieved by the single-bit/multi-bit stage 300 during this clock phase is only 1.5 bits, since only two comparators 302, 304 of the sub-ADC 400 are used.

Figure 10:
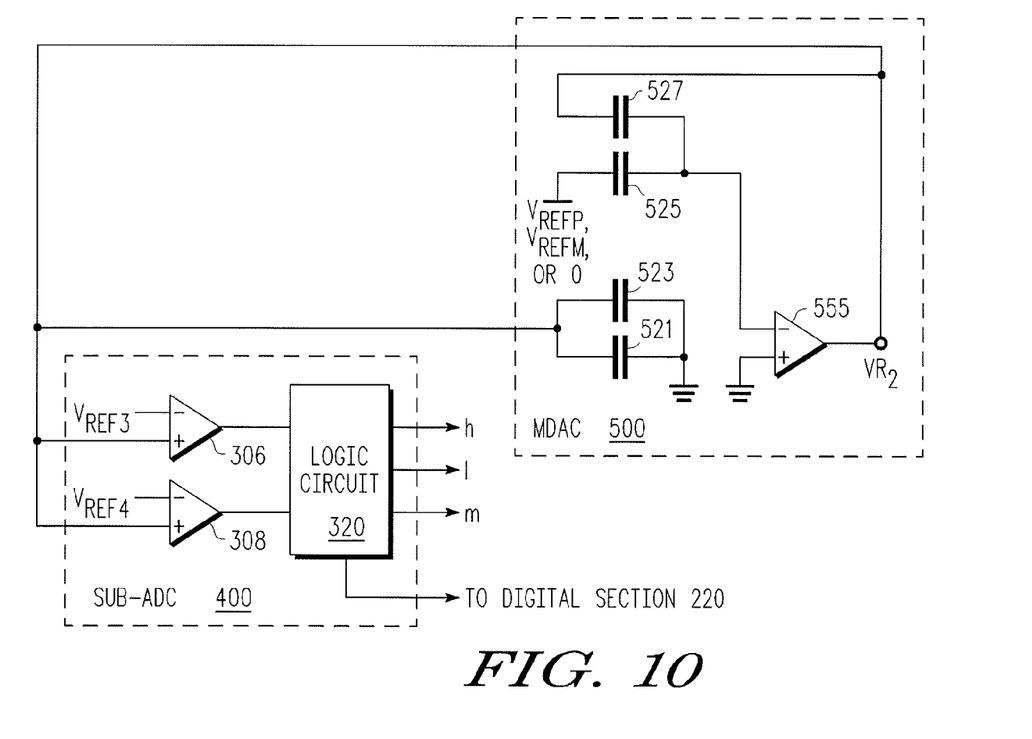
FIG. 10 is a simplified circuit diagram illustrating the configuration of the sub-ADC of FIG. 4 and the MDAC of FIG. 5 during the fourth clock phase of the example 10-bit A/D conversion process.

FIG. 10 is a simplified circuit diagram illustrating the configuration of the sub-ADC 400 and the MDAC 500 during the fourth clock phase of the example 10-bit A/D conversion process. During the fourth clock phase, the op-amp 555 generates a new residual voltage feedback signal $VR_2$ from the previous residual voltage feedback signal $VR_1$ based on the control signals (h, l, m) from the previous third clock phase. The residual voltage feedback signal $VR_2$ is held and sampled on to the capacitors 521 and 523 as well as sampled by the comparators 306, 308 of the sub-ADC 400. During the fourth clock phase, the third predetermined voltage signal (VREF3) may be the predetermined high voltage (VH) that is applied to the negative input terminal of the third comparator 306. During the fourth clock phase, the fourth predetermined voltage signal (VREF4) may be the predetermined low voltage (VL) that is applied to the negative input terminal of the fourth comparator 308. Based upon the output signals from the comparators 306, 308, the sub-ADC 400 may generate new values for the high, low, and mid-switch control signals (h, l, and m). The sub-ADC 400 also generates two raw digital bits at the end of the fourth clock phase, which are sent to the digital section 220 of FIG. 2.

Figure 11:
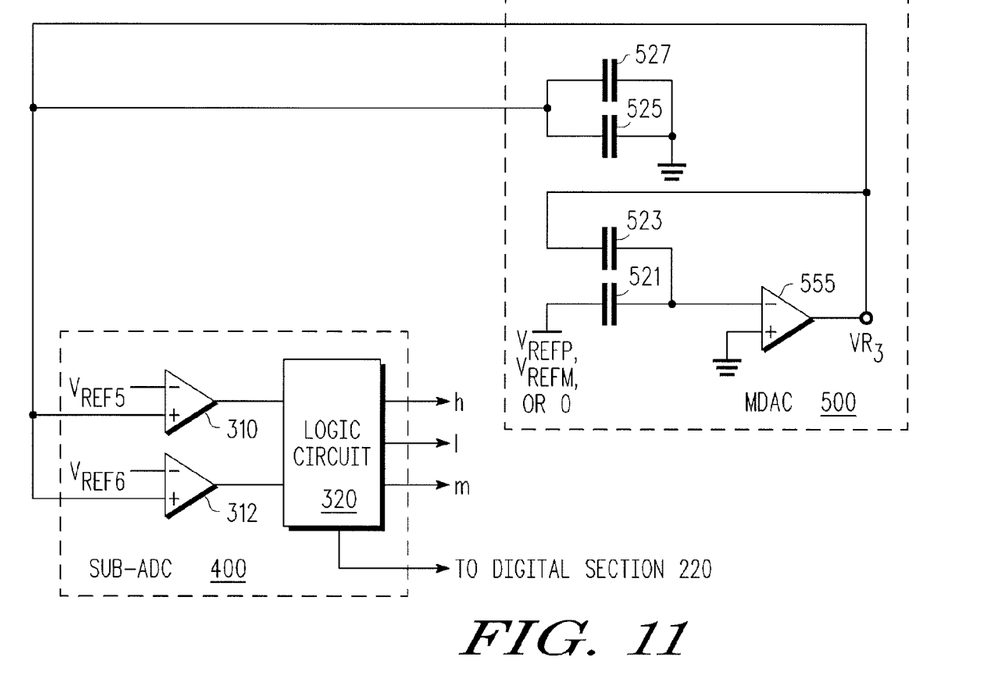
FIG. 11 is a simplified circuit diagram illustrating the configuration of the sub-ADC of FIG. 4 and the MDAC of FIG. 5 during the fifth clock phase of the example 10-bit A/D conversion process.

FIG. 11 is a simplified circuit diagram illustrating the configuration of the sub-ADC 400 and the MDAC 500 during the fifth clock phase of the example 10-bit A/D conversion process. During the fifth clock phase, the op-amp 555 generates a new residual voltage feedback signal $VR_3$ from the previous residual voltage feedback signal $VR_2$ based on the control signals (h, l, m) from the previous fourth clock phase. The residual voltage feedback signal $VR_3$ is held and sampled on to the capacitors 525 and 527 as well as sampled by the comparators 310, 312 of the sub-ADC 400. During the fifth clock phase, the fifth predetermined voltage signal (VREF5) may be the predetermined high voltage (VH) that is applied to the negative input terminal of the fifth comparator 310. During the fifth clock phase, the sixth predetermined voltage signal (VREF6) may be the predetermined low voltage (VL) that is applied to the negative input terminal of the sixth comparator 312. Based upon the output signals from the comparators 310, 312, the sub-ADC 400 may generate new values for the high, low, and mid-switch control signals h, l, and m. The sub-ADC 400 also generates two raw digital bits at the end of the fifth clock phase, which are sent to the digital section 220 of FIG. 2.

Figure 12:
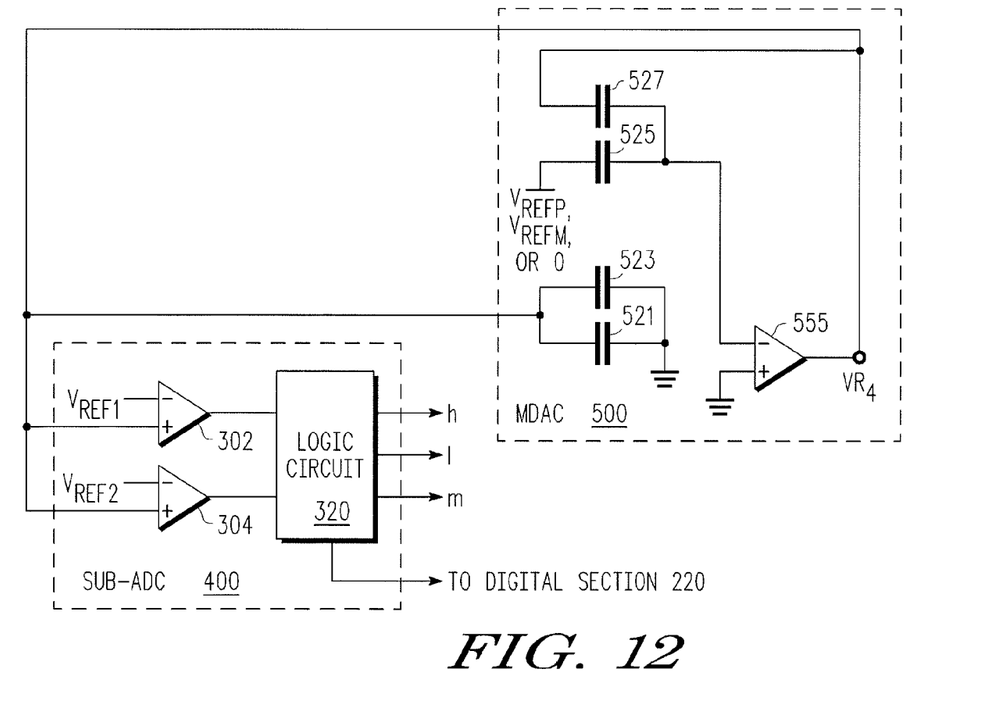
FIG. 12 is a simplified circuit diagram illustrating the configuration of the sub-ADC of FIG. 4 and the MDAC of FIG. 5 during the sixth clock phase of the example 10-bit A/D conversion process.

FIG. 12 is a simplified circuit diagram illustrating the configuration of the sub-ADC 400 and the MDAC 500 during the sixth clock phase of the example 10-bit A/D conversion process. During the sixth clock phase, the op-amp 555 generates a new residual voltage feedback signal $VR_4$ from the previous residual voltage feedback signal $VR_3$ based on the control signals (h, l, m) from the previous fifth clock phase. The residual voltage feedback signal $VR_4$ is held and sampled on to the capacitors 521 and 523 as well as sampled by the comparators 302, 304 of the sub-ADC 400. During the sixth clock phase, the first predetermined voltage signal (VREF1) may be the predetermined high voltage (VH) that is applied to the negative input terminal of the first comparator 302. During the sixth clock phase, the second predetermined voltage signal (VREF2) may be the predetermined low voltage (VL) that is applied to the negative input terminal of the sixth comparator 304. Based upon the output signals from the comparators 302, 304 the sub-ADC 400 may generate new values for the high, low, and mid-switch control signals (h, l, and m). The sub-ADC 400 also generates two raw digital bits at the end of the sixth clock phase, which are sent to the digital section 220 of FIG. 2.

Figure 13:
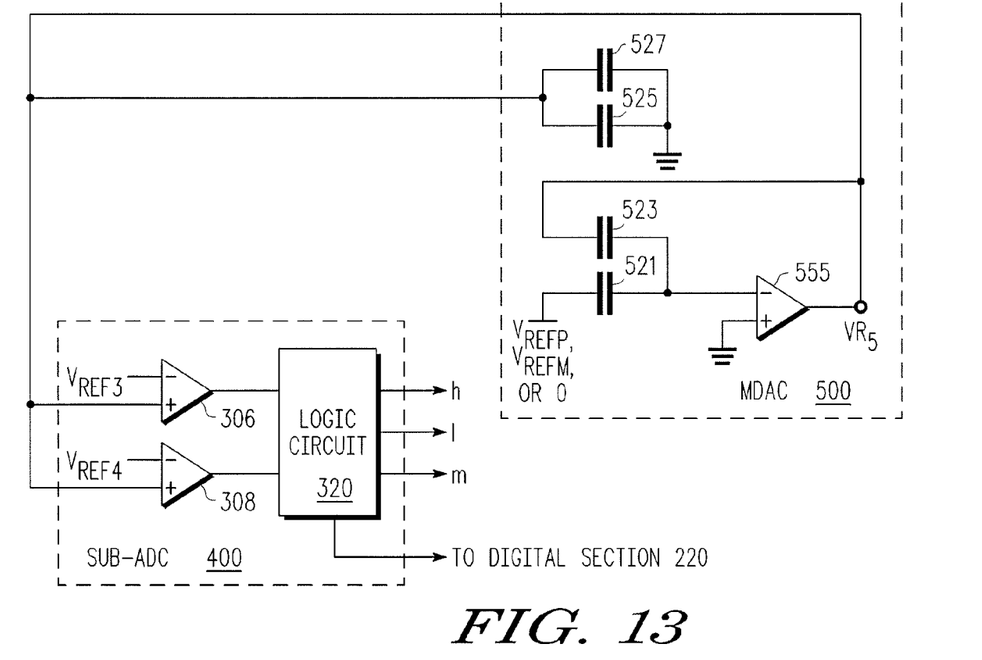
FIG. 13 is a simplified circuit diagram illustrating the configuration of the sub-ADC of FIG. 4 and the MDAC of FIG. 5 during the seventh clock phase of the example 10-bit A/D conversion process.

FIG. 13 is a simplified circuit diagram illustrating the configuration of the sub-ADC 400 and the MDAC 500 during the seventh clock phase of the example 10-bit A/D conversion process. During the seventh clock phase, the op-amp 555 generates a new residual voltage feedback signal $VR_5$ from the previous residual voltage feedback signal $VR_4$ based on the control signals (h, l, m) from the previous sixth clock phase. The residual voltage feedback signal $VR_5$ is held and sampled on to the capacitors 525 and 527 as well as sampled by the comparators 306, 308 of the sub-ADC 400. During the seventh clock phase, the third predetermined voltage signal (VREF3) may be the predetermined high voltage (VH) that is applied to the negative input terminal of the third comparator 306. During the seventh clock phase, the fourth predetermined voltage signal (VREF4) may be the predetermined low voltage (VL) that is applied to the negative input terminal of the fourth comparator 308. Based upon the output signals from the comparators 306, 308 the sub-ADC 400 may generate new values for the high, low, and mid-switch control signals (h, l, and m). The sub-ADC 400 also generates two raw digital bits at the end of the seventh clock phase, which are sent to the digital section 220 of FIG. 2.

Figure 14:
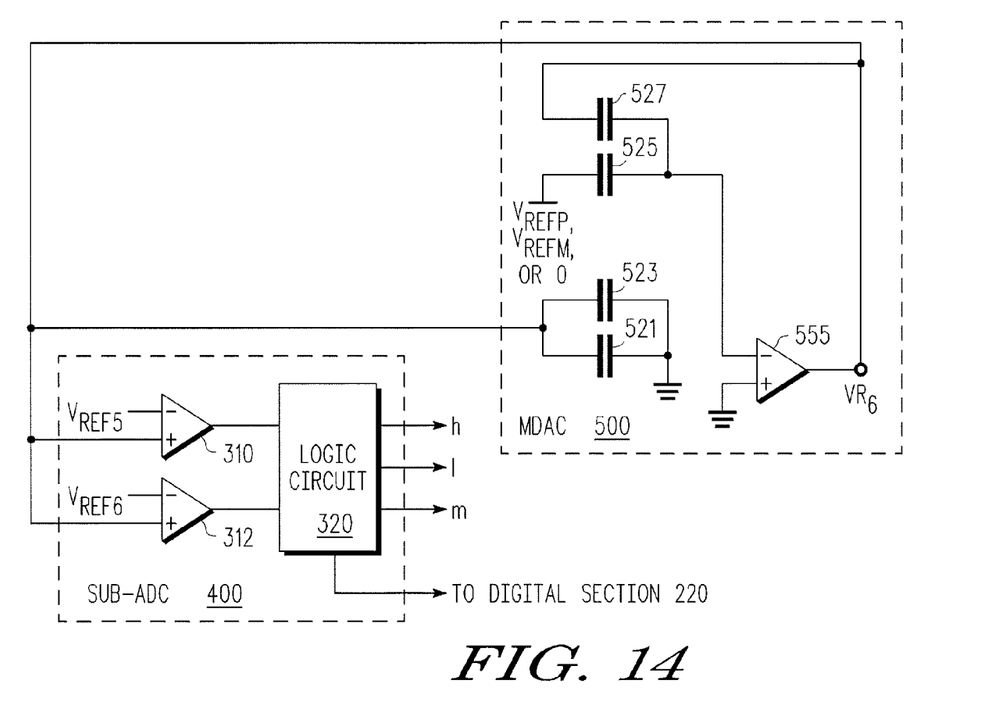
FIG. 14 is a simplified circuit diagram illustrating the configuration of the sub-ADC of FIG. 4 and the MDAC of FIG. 5 during the eighth clock phase of the example 10-bit A/D conversion process.

FIG. 14 is a simplified circuit diagram illustrating the configuration of the sub-ADC 400 and the MDAC 500 during the eighth clock phase of the example 10-bit A/D conversion process. During the eighth clock phase, the op-amp 555 generates a new residual voltage feedback signal $VR_6$ from the previous residual voltage feedback signal $VR_5$ based on the control signals (h, l, m) from the previous seventh clock phase. The residual voltage feedback signal $VR_6$ is held and sampled on to the capacitors 521 and 523 as well as sampled by the comparators 310, 312 of the sub-ADC 400. During the eighth clock phase, the fifth predetermined voltage signal (VREF5) may be the predetermined high voltage (VH) that is applied to the negative input terminal of the fifth comparator 310. During the eighth clock phase, the sixth predetermined voltage signal (VREF6) may be the predetermined low voltage (VL) that is applied to the negative input terminal of the sixth comparator 312. Based upon the output signals from the comparators 310, 312 the sub-ADC 400 may generate new values for the high, low, and mid-switch control signals (h, l, and m). The sub-ADC 400 also generates two raw digital bits at the end of the eighth clock phase, which are sent to the digital section 220 of FIG. 2.

Figure 15:
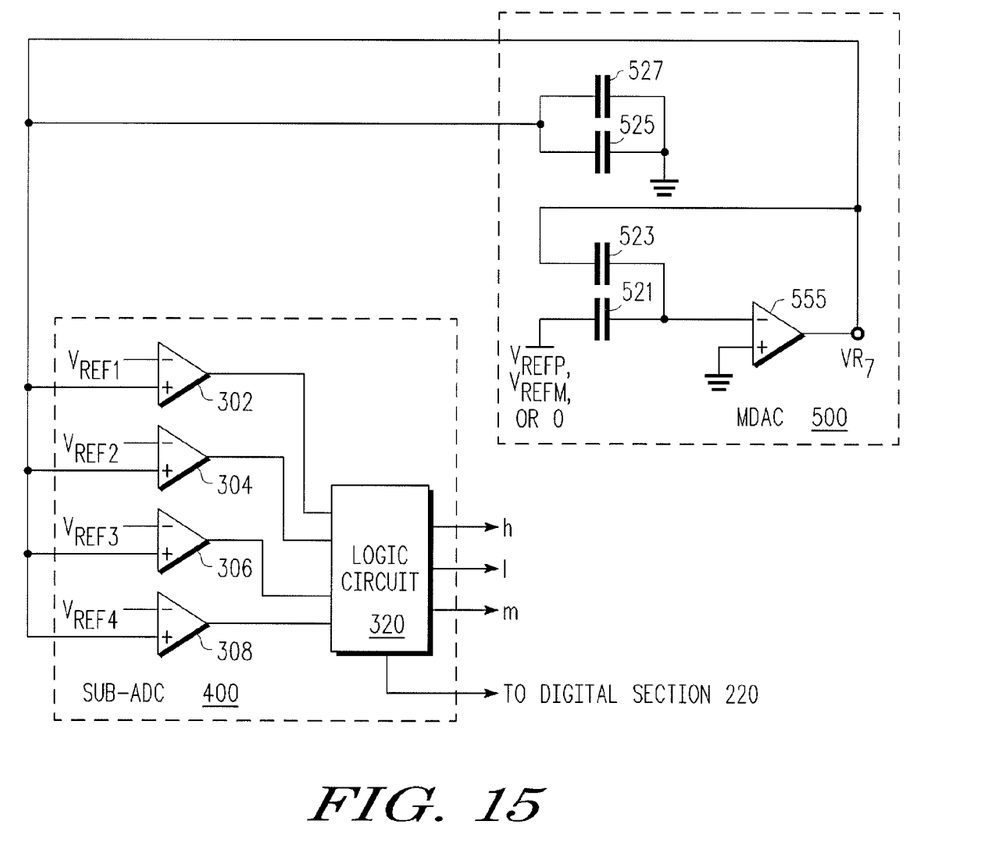
FIG. 15 is a simplified circuit diagram illustrating the configuration of the sub-ADC of FIG. 4 and the MDAC of FIG. 5 during the ninth clock phase of the example 10-bit A/D conversion process.

FIG. 15 is a simplified circuit diagram illustrating the configuration of the sub-ADC 400 and the MDAC 500 during the ninth clock phase of the example 10-bit A/D conversion process. During the ninth clock phase, the op-amp 555 generates a new residual voltage feedback signal $VR_7$ from the previous residual voltage feedback signal $VR_6$ based on the control signals (h, l, m) from the previous eighth clock phase. The residual voltage feedback signal $VR_7$ is held and sampled on to the capacitors 527 and 525 as well as sampled by the comparators 302, 304, 306, 308 of the sub-ADC 400. During the ninth clock phase, the first and third predetermined voltage signals (VREF1, VREF3) may be the predetermined high voltage (VH) that is applied to the negative input terminals of the first and third comparators 302, 306. During the ninth clock phase, the second and fourth predetermined voltage signals (VREF2, VREF4) may be the predetermined low voltage (VL) that is applied to the negative input terminals of the second and fourth comparators 304, 308. Based upon the output signals from the comparators 302, 304, 306, 308 the sub-ADC 400 may generate new values for the high, low, and mid-switch control signals (h, l, and m). The sub-ADC 400 also generates two raw digital bits at the end of the ninth clock phase, which are sent to the digital section 220 of FIG. 2.

As explained above, the raw digital bits obtained from the sub-ADC 400 in the example 10-bit A/D conversion were sent to the digital section 220 of FIG. 2 during the first clock phase and during the third through ninth clock phases. In particular, the raw digital bits are sent to the alignment and synchronization block 230 of FIG. 2, where they are aligned and synchronized. During the tenth clock phase of the example 10-bit A/D conversion process, a digital correction is performed in the correction block 240 to produce a 10-bit binary word at the end of the tenth clock phase, completing the example 10-bit A/D conversion. The process may then be repeated in the manner described above to produce a second 10-bit binary word. An observant reader will recognize that the number of raw digital bits obtained from the sub-ADC 400 in the example 10-bit A/D conversion described above was actually greater than 10 bits. This discrepancy is accounted for because in each one of the clock phases that results in raw digital bits being output from the sub-ADC 400, one of the raw bits is redundant and is discarded during further processing in the digital section 220. Thus, three raw digital bits from the sub-ADC during one clock phase produced two bits for the 10-bit A/D conversion, and two raw digital bits from the sub-ADC during one clock phase produced one bit of the 10-bit A/D conversion.

According to the example 10-bit A/D conversion described above, five clock cycles are needed to produce a 10-bit binary word. Thus, generalizing to any n-bit A/D conversion where n is even, an n-bit binary word may be produced in n/2 clock cycles. In alternative embodiments, the sub-ADC 400 and the MDAC 500 could be configured to produce two raw digital bits during, for example, the ninth clock phase that was described above as producing three raw digital bits for the example 10-bit A/D conversion. Thus, generalizing to any n-bit A/D conversion where n is odd, an n-bit binary word may be produced in (n+1)/2 clock cycles. The number of clock cycles used in the example 10-bit conversion described above is not significantly different from the number of clock cycles required by the single multi-bit A/D converter described in U.S. Pat. No. 6,535,157, which may produce two digital bits during one clock phase of every clock cycle. However, those skilled in the art will appreciate that because the sub-ADC 400 and the MDAC 500 of the example embodiment can be continually reconfigured to produce two raw digital bits during every clock phase for a clock cycle after an initial clock cycle, the example embodiment can achieve the same performance with reduced thermal noise, area, and power.

For example, in the 10-bit conversion described above, the first clock phase of the first clock cycle and the ninth clock phase of the fifth clock cycle were used to produce three raw digital bits from the sub-ADC 400. The sub-ADC 400 was not used during the second clock phase of the first clock cycle. In the second through fourth clock cycles, however, by efficiently reconfiguring circuitry in the MDAC 500 during each clock phase to perform a different function, the sub-ADC 400 was used during each clock phase to produce two raw digital bits in each clock phase. Thus, according to example embodiments a single RSD A/D conversion stage can be initially configured to output at least three raw bits during an initial conversion clock cycle, then be subsequently reconfigured to output two raw bits during every clock phase of subsequent conversion clock cycles in order to determine the remaining bits of the A/D conversion with reduced capacitance, reduced area, and reduced power requirements.

Based on the above, it should be apparent that example embodiments include a single RSD stage that can be selectively reconfigured to have different bit resolutions during different clock phases or clock cycles of an A/D conversion process. In the particular example described above, the initial resolution was 2.5 bits, and the subsequent resolution was 1.5 bits.

The example embodiment described above can achieve the same sample rate and resolution as the architecture described in U.S. Pat. No. 6,535,157, but the reconfiguration from a 2.5 bit resolution stage in the first conversion clock cycle to a 1.5 bit resolution stage in subsequent clock cycles as described above enables it to do so with approximately a 40% reduction in total capacitance due to reduced thermal noise and approximately a 25% reduction in area and power.

Figure 16:
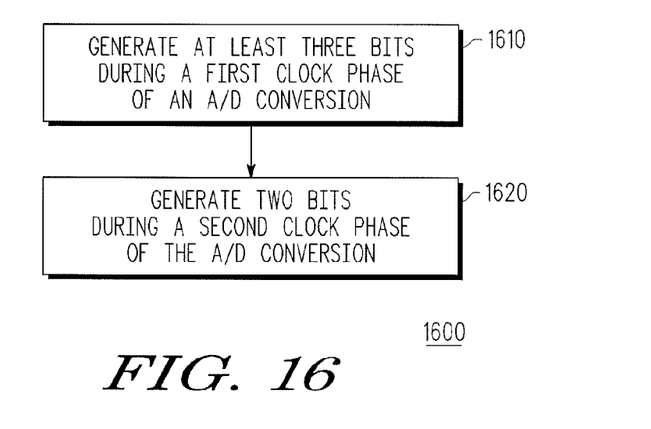
FIG. 16 is a flowchart illustrating example processes included in a method of A/D conversion according to an example embodiment.

FIG. 16 is a flowchart illustrating a few example processes included in a method according to an example embodiment. Referring to FIG. 16, a method 1600 according to an example embodiment starts with process 1610. Process 1610 includes generating, with a single RSD stage, at least three bits of raw digital data during a first clock phase of an A/D conversion of an analog signal. Process 1620 occurs after process 1610, and includes generating, with the same single RSD stage, two bits of digital data during a second clock phase of the A/D conversion.

While the order of processes 1610 and 1620 as illustrated in FIG. 16 is preferred, alternative embodiments may instead reverse the order, placing process 1620 prior to process 1610. In alternative embodiments, there may also be at least one intervening clock phase between the first clock phase and the second clock phase of the A/D conversion of the analog signal. In other words, the second clock phase of process 1620 does not necessarily occur immediately after the first clock phase of process 1610. It should also be appreciated that the first clock phase of process 1610 need not be the sequentially first clock phase in any particular A/D conversion process, although this is preferred.

According to an example embodiment, a converter adapted to convert an analog input signal into a digital output signal includes an analog input terminal for receiving the analog input signal, and a Redundant Signed Digit (RSD) stage coupled to the analog input terminal. According to the example embodiment, the RSD is stage is configured to receive the analog input signal at the analog input terminal, produce a first number of bits at a digital output from the analog input signal during a first half of a first clock cycle, provide a residual feedback signal of the analog input signal at the analog input terminal during a second half of the first clock cycle, and produce a second number of bits at the digital output from the residual feedback signal during a first half of a second clock cycle, the second number of bits less than the first number of bits. According to the example embodiment, the converter further includes a digital section coupled to the digital output, the digital section configured to perform a digital alignment and correction on the first number of bits and the second number of bits to generate the digital output signal.

According to an example embodiment, the RSD stage includes a Multiplying Digital to Analog Converter (MDAC)

that is operable to produce the residual feedback signal, and a subsidiary Analog to Digital Converter (sub-ADC) that is operable to produce the first number of bits based upon the analog input signal and that is operable to produce the second number of bits based upon the residual feedback signal. According to an example embodiment, the sub-ADC includes a plurality of comparators coupled to the analog input terminal and configured to compare the residual feedback signal to a plurality of predetermined voltages, and a logic circuit coupled to the plurality of comparators and configured to generate the first number of bits based at least upon outputs from a first set of the comparators, the logic circuit further configured to generate the second number of bits based at least upon outputs from a second set of comparators, the second set of comparators a subset of the first set of comparators.

According to an example embodiment, the MDAC includes an operational amplifier operable to generate the residual feedback signal, a first capacitor that is coupled to a first node, a second capacitor that is coupled to the first node, a third capacitor that is coupled to a second node, a fourth capacitor that is coupled to the second node, a first switch that is coupled between an input of the op-amp and the first node, and a second switch that is coupled between the input of the op-amp and the second node. According to an example embodiment, the MDAC further includes a third switch coupled between the first node and the second node.

According to an example embodiment, the RSD stage is further configured to produce a third number of bits during a second half of the second clock cycle, the third number equal to the second number. According to an example embodiment, the first number is three and the second number is two.

According to another example embodiment, a cyclic Redundant Signed Digit (RSD) Analog to Digital (A/D) converter includes an input terminal for receiving an analog input signal, a first switch connected between the input terminal and a first node, the first switch operable to apply the analog input signal to the first node, a second switch connected between the first node and a second node, the second switch operable to apply a residual voltage feedback signal to the first node, the first switch operable to be closed when the second switch is open, the second switch operable to be closed when the first switch is open. According to the embodiment, the cyclic RSD A/D converter includes an operational amplifier having an output terminal connected to the second node, the operational amplifier operable to generate the residual voltage feedback signal and apply it to the second node, and comparators, each comparator having a first input coupled to the first node and an output, each of the comparators operable to compare a selected one of the analog input signal and the residual voltage feedback signal to a predetermined voltage signal. The cyclic RSD A/D converter further includes a logic circuit coupled to the outputs of the comparators, the logic circuit operable to generate a first digital output signal during a first clock phase of an A/D conversion and operable to generate a second digital output signal during a second clock phase of the A/D conversion, the first digital output signal based upon the outputs from a first set of the comparators, the second digital output signal based upon the outputs from a second set of the comparators.

According to an example embodiment, the first digital output signal includes three digital bits, while the second digital output signal consists of two digital bits. According to an example embodiment, the second clock phase is subsequent to the first clock phase, and there is at least one intervening clock phase between the first clock phase and the second clock phase. According to an example embodiment, the second set of comparators is a subset of the first set of comparators. According to an example embodiment, the first digital output signal comprises three digital bits, and the second digital output signal consists of two digital bits. According to an example embodiment, a clock cycle of the A/D conversion consists of the first clock phase and the second clock phase.

According to another example embodiment, a method for converting an analog input signal into a plurality of digital bits during a plurality of clock cycles using a single Redundant Signed Digit (RSD) stage of an Analog to Digital (A/D) converter includes the steps of receiving the analog input signal, and producing a first number of the digital bits at a first resolution during one of the clock cycles and producing a second number of the digital bits at a second resolution during another one of the clock cycles.

According to an example embodiment, producing the first number of digital bits and the second number of digital bits comprises the steps of producing the first number of the digital bits from the analog input signal during a first half of a first clock cycle, producing a first residual voltage from the analog input signal during a second half of the first clock cycle, and producing the second number of the digital bits from the first residual voltage during a first half of a second clock cycle. According to an example embodiment, the first resolution is at least 2.5 bits, and the second resolution is less than the first resolution. According to an example embodiment, the second resolution is 1.5 bits. According to an example embodiment, the first half of the second clock cycle occurs following the second half of the first clock cycle.

According to an example embodiment, the method further includes the step of producing a second residual voltage from the first residual voltage during a second half of the second clock cycle. According to an example embodiment, the method further includes the step of producing a third number of digital bits at the second resolution from the second residual voltage during the second half of the second clock cycle.

It shall be apparent to those of ordinary skill, based upon the limited number of example embodiments described above, that many other embodiments that incorporate one or more of the inventive principles that were associated with the described example embodiments exist. In the following paragraphs, more descriptions of example, non-limiting embodiments are presented.

While at least one example embodiment has been presented in the foregoing detailed description, it should be appreciated that a vast number of variations exist, especially with respect to choices of device types and materials and the sequence of processes. It should further be emphasized that the example embodiments described above are only examples, and are not intended to limit the scope, applicability, or configuration in any way. Rather, the detailed description of the example embodiments provides those skilled in the art with a convenient road map for implementing the inventive principles contained in the example embodiments. The inventors regard the subject matter to include all combinations and subcombinations of the various elements, features, functions and/or properties disclosed herein. It should also be understood that various changes can be made in the function and arrangement of elements without departing from the scope as set forth in the appended claims and the legal equivalents thereof.

The invention claimed is:

1. A converter adapted to convert an analog input signal into a digital output signal, comprising:

an analog input terminal for receiving the analog input signal;
a Redundant Signed Digit (RSD) stage coupled to the analog input terminal, said RSD stage configured to:
receive the analog input signal at the analog input terminal;
produce a first number of bits at a digital output from the analog input signal during a first half of a first clock cycle;
provide a residual feedback signal of the analog input signal at the analog input terminal during a second half of the first clock cycle; and
produce a second number of bits at the digital output from the residual feedback signal during a first half of a second clock cycle, the second number of bits less than the first number of bits; and
a digital section coupled to the digital output, the digital section configured to perform a digital alignment and correction on the first number of bits and the second number of bits to generate the digital output signal.

2. The converter of claim 1, the RSD stage comprising:
A Multiplying Digital to Analog Converter (MDAC) that is operable to produce the residual feedback signal; and
A subsidiary Analog to Digital Converter (sub-ADC) that is operable to produce the first number of bits based upon the analog input signal and that is operable to produce the second number of bits based upon the residual feedback signal.

3. The converter of claim 2, the sub-ADC comprising:
a plurality of comparators coupled to the analog input terminal and configured to compare the residual feedback signal to a plurality of predetermined voltages; and
a logic circuit coupled to the plurality of comparators and configured to generate the first number of bits based at least upon outputs from a first set of the comparators, the logic circuit further configured to generate the second number of bits based at least upon outputs from a second set of comparators, the second set of comparators a subset of the first set of comparators.

4. The converter of claim 3, the MDAC comprising:
an operational amplifier operable to generate the residual feedback signal;
a first capacitor that is coupled to a first node;
a second capacitor that is coupled to the first node;
a third capacitor that is coupled to a second node;
a fourth capacitor that is coupled to the second node;
a first switch that is coupled between an input of the op-amp and the first node; and
a second switch that is coupled between the input of the op-amp and the second node.

5. The converter of claim 4, the MDAC further comprising a third switch coupled between the first node and the second node.

6. The converter of claim 1, wherein the RSD stage is further configured to produce a third number of bits during a second half of the second clock cycle, the third number equal to the second number.

7. The converter of claim 6, wherein the first number is three and the second number is two.

8. A cyclic Redundant Signed Digit (RSD) Analog to Digital (A/D) converter comprising:
an input terminal for receiving an analog input signal;
a first switch connected between the input terminal and a first node, the first switch operable to apply the analog input signal to the first node;
a second switch connected between the first node and a second node, the second switch operable to apply a residual voltage feedback signal to the first node, the first switch operable to be closed when the second switch is open, the second switch operable to be closed when the first switch is open;
an operational amplifier having an output terminal connected to the second node, the operational amplifier operable to generate the residual voltage feedback signal and apply it to the second node;
comparators, each comparator having a first input coupled to the first node and an output, each of the comparators operable to compare a selected one of the analog input signal and the residual voltage feedback signal to a predetermined voltage signal; and
a logic circuit coupled to the outputs of the comparators, the logic circuit operable to generate a first digital output signal during a first clock phase of an A/D conversion and operable to generate a second digital output signal during a second clock phase of the A/D conversion, the first digital output signal based upon the outputs from a first set of the comparators, the second digital output signal based upon the outputs from a second set of the comparators.

9. The cyclic RSD A/D converter of claim 8, the first digital output signal comprising three digital bits, the second digital output signal consisting of two digital bits.

10. The cyclic RSD A/D converter of claim 9, wherein the second clock phase is subsequent to the first clock phase, and wherein there is at least one intervening clock phase between the first clock phase and the second clock phase.

11. The cyclic RSD A/D converter of claim 9, wherein the second set of comparators is a subset of the first set of comparators.

12. The cyclic RSD A/D converter of claim 8, the first digital output signal comprising three digital bits, the second digital output signal consisting of two digital bits.

13. The cyclic RSD A/D converter of claim 12, wherein a clock cycle of the A/D conversion consists of the first clock phase and the second clock phase.

14. A method for converting an analog input signal into a plurality of digital bits during a plurality of clock cycles using a single Redundant Signed Digit (RSD) stage of an Analog to Digital (A/D) converter, the method comprising the steps of:
receiving the analog input signal; and
producing a first number of the digital bits at a first resolution during one of the clock cycles and producing a second number of the digital bits at a second resolution during another one of the clock cycles, wherein producing the first number of digital bits and the second number of digital bits comprises the steps of:
producing the first number of the digital bits from the analog input signal during a first half of a first clock cycle;
producing a first residual voltage from the analog input signal during a second half of the first clock cycle; and
producing the second number of the digital bits from the first residual voltage during a first half of a second clock cycle.

15. A method for converting an analog input signal into a plurality of digital bits during a plurality of clock cycles using a single Redundant Signed Digit (RSD) stage of an Analog to Digital (A/D) converter, the method comprising the steps of:
receiving the analog input signal; and
producing a first number of the digital bits at a first resolution during one of the clock cycles and producing a second number of the digital bits at a second resolution during another one of the clock cycles, wherein the first resolution is at least 2.5 bits, and wherein the second resolution is less than the first resolution.

16. The method of claim 15, wherein the second resolution is 1.5 bits.

17. The method of claim 14, wherein the first half of the second clock cycle occurs following the second half of the first clock cycle.

18. The method of claim 14, further comprising the step of producing a second residual voltage from the first residual voltage during a second half of the second clock cycle.

19. The method of claim 18, further comprising the step of producing a third number of digital bits at the second resolution from the second residual voltage during the second half of the second clock cycle.

* * * * *